United States Patent
Ishino et al.

(10) Patent No.: US 6,194,933 B1
(45) Date of Patent: Feb. 27, 2001

(54) INPUT CIRCUIT FOR DECREASED PHASE LAG

(75) Inventors: Kouji Ishino; Yoshiharu Kato, both of Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/251,471

(22) Filed: Feb. 17, 1999

(30) Foreign Application Priority Data

May 22, 1998 (JP) .................................................. 10-141245

(51) Int. Cl.[7] ........................................................ H03L 7/00

(52) U.S. Cl. ............................ 327/163; 327/141; 327/172; 327/246; 327/280

(58) Field of Search ..................................... 327/141, 161, 327/163, 172, 232, 237, 246, 280, 281

(56) References Cited

U.S. PATENT DOCUMENTS 5,286,972 * 2/1994 Falk et al. ........................ 250/231.16

* cited by examiner

Primary Examiner—Kenneth B. Wells
Assistant Examiner—Cassandra Cox
(74) Attorney, Agent, or Firm—Arent Fox Kintner Plotkin & Kahn PLLC

(57) ABSTRACT

An input circuit for use in a semiconductor integrated circuit decreases a phase lag between a clock signal and an input signal. The input circuit includes a first amplifier that receives an external clock signal at a first input and a reference voltage signal at a second input, and generates an amplified clock signal, and a second amplifier that receives an external input signal at a first input and the reference voltage at a second input, and generates an amplified input signal. A latch circuit is connected to the first and second amplifiers and receives the amplified clock signal at its clock input and the amplified input signal at its data input. The first and second amplifiers receive a high voltage supply signal from a common a high potential power supply and a low voltage supply signal from a common low potential power supply.

26 Claims, 15 Drawing Sheets

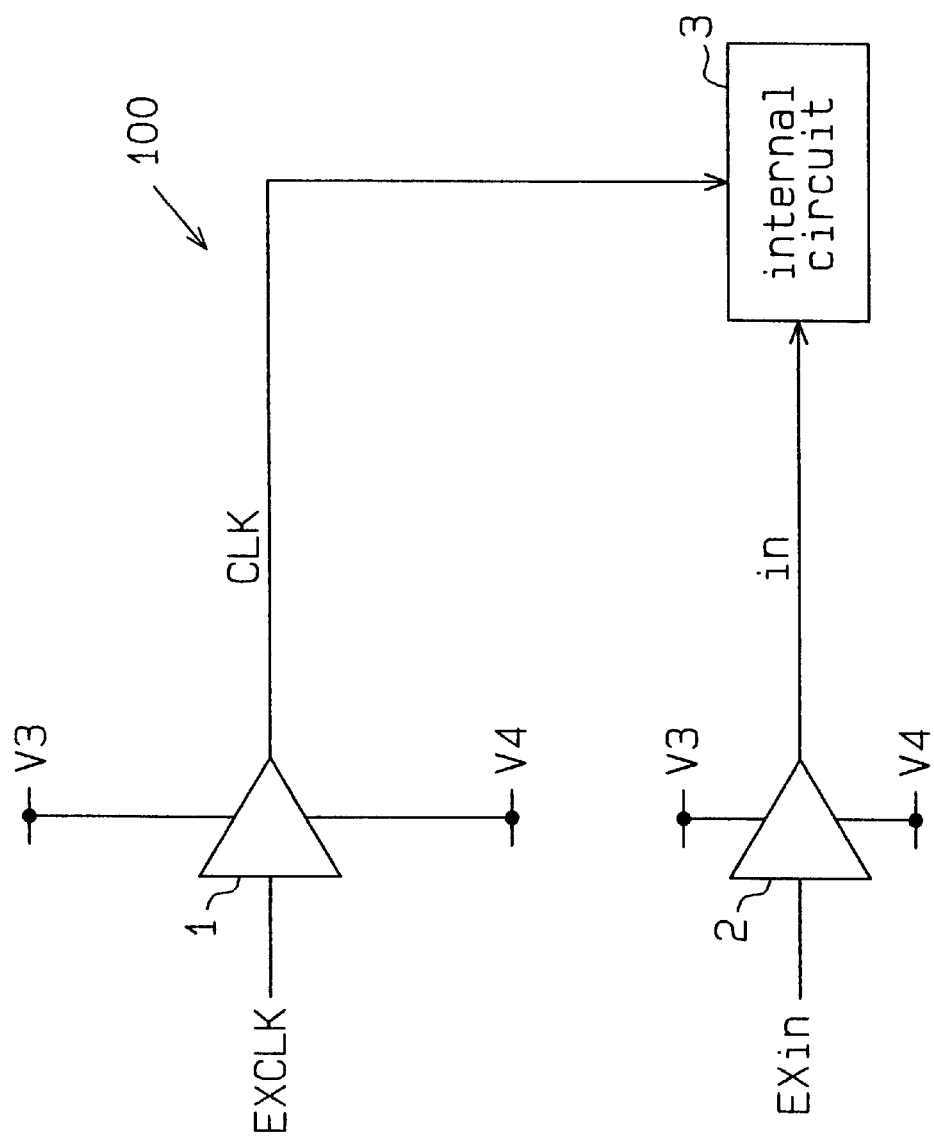

INPUT CIRCUIT FOR DECREASED PHASE LAG

BACKGROUND OF THE INVENTION

The present invention relates to an input circuit, and, more particularly, to an input circuit that amplifies an external input signal having a relatively small amplitude and an external clock signal.

With the higher speed and the lower power consumption of todays computer systems, lower power supply voltages are also required by the semiconductor devices inside the systems. Consequently, the amplitude of a signal provided to the semiconductor devices has been reduced. Therefore, in order to efficiently amplify the small amplitude signal, the semiconductor devices includes an input circuit which receives power from an internal power supply, which steps up or steps down voltages of an external power supply.

As shown in FIG. 1, a conventional input circuit 50 comprises a first differential amplifier 51, a second differential amplifier 52 and a latch circuit 53. Power is supplied to the first differential amplifier 51 from a high potential power supply Vdd and a low potential power supply Vss. The first differential amplifier 51 receives an external clock signal EXCLK and a reference voltage Vref. The first differential amplifier 51 amplifies the external clock signal EXCLK using the reference voltage Vref as a threshold, and provides the latch circuit 53 with a clock signal CLK having an amplitude equal to the potential difference between the power supplies Vdd and Vcc. As shown in FIGS. 2(a) and 2(b), the first differential amplifier 51 amplifies the external clock signal EXCLK having relatively small amplitude to generate the clock signal CLK.

Referring back to FIG. 1, power is supplied to the second differential amplifier 52 from the high potential power supply Vdd and a step-down voltage power supply Vssi produced by stepping down the voltage of the low potential power supply Vss with a step down voltage circuit (not illustrated). The second differential amplifier 52 receives an external input signal EXin and the reference voltage Vref. The second differential amplifier 52 amplifies the external input signal EXin using the reference voltage Vref as the threshold, and provides the latch circuit 53 with an input signal Sin having an amplitude equal to the potential difference between the power supplies Vdd and Vssi. The second differential amplifier 52 produces the amplified input signal Sin by amplifying the external input signal EXin, which has a relatively small amplitude.

The latch circuit 53 receives the input signal Sin from the second differential amplifier 52 and latches it in response to the rising of the clock signal CLK from the first differential amplifier 51. Then, the latch circuit 53 provides the latched input signal Sin, as an output signal Sout, to a next stage (not illustrated).

As shown in FIGS. 2(a) and 2(c), the clock signal CLK is delayed by an operating delay time t1 of the first differential amplifier 51 with respect to the external clock signal EXCLK. Similarly, the input signal Sin is delayed by an operating delay time t2 of the second differential amplifier 52 with respect to the external input signal EXin. However, although the operating delay time t1 of the differential amplifier 51 is constant, the operating delay time t2 of the differential amplifier 52 varies. In this case, the delay time t2 gradually increases.

Specifically, since the power supplies Vdd and Vss supplied to the first differential amplifier 51 are generally stable, the drive capability of the first differential amplifier 51 does not vary. However, the step-down voltage power supply Vssi produced by the step down voltage circuit is unstable. As shown in FIG. 2(e), the voltage level of the step-down voltage power supply Vssi gradually increases, so that the drive capability of the second differential amplifier 52 gradually decreases. Therefore, the operating delay time t2 of the second differential amplifier 52 gradually increases. As a result, a phase shift occurs between the clock signal CLK and the input signal Sin. With the variation of the step-down voltage power supply Vssi, the level of the amplified input, signal Sin can also vary, although the variation does not affect the operation of the input circuit 50.

When the relative relationship between the clock signal CLK and the input signal Sin is changed, the latch circuit 53 may not receive the input signal Sin correctly in response to the rising of the clock signal CLK, in which case, the latch circuit 53 outputs the incorrect output signal Sout.

The object of the present invention is to provide an input circuit which decreases the phase lag between a clock signal and an input signal.

SUMMARY OF THE INVENTION

To achieve the above objective, the present invention provides an input circuit comprising: a first amplifier which receives external clock signal and amplifies the external clock signal to generate an internal clock signal; a second amplifier which receives an external input signal and amplifies the external signal to generate an internal input signal; and an internal circuit, connected to the first and the second amplifiers, which receives the internal signal from the second amplifier in response to the internal clock signal from the first amplifier; wherein the first and second amplifiers receive power from a high potential power supply and a low potential power supply, and a pair of the high potential power supply and the low potential power supply is selected from a group consisting of: an external high potential power supply and a step-down voltage power supply that steps down a voltage received from an external low potential power supply; an external low potential power supply and a step-up voltage power supply that steps up a voltage received from an external high potential power supply; and a step-down voltage power supply that steps down a voltage received from an external low potential power supply and a step-up voltage power supply that steps up a voltage received from an external high potential power supply.

The present invention further provides an input circuit, comprising: a first amplifier receiving an external clock signal at a first input and a reference voltage signal at a second input, and generating an amplified clock signal; a second amplifier receiving an external input signal at a first input and the reference voltage at a second input, and generating an amplified input signal; and a latch circuit connected to the first and second amplifiers, the latch circuit receiving the amplified clock signal at a clock input thereof and receiving the amplified input signal at a data input thereof, wherein the first and second amplifiers receive a high voltage supply signal from a common a high potential power supply and a low voltage supply signal from a common low potential power supply.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 3 is a schematic block diagram of an input circuit of the present invention;

DETAILED DESCRIPTION OF THE PREFERRED EMBODIMENTS

Figure 1:
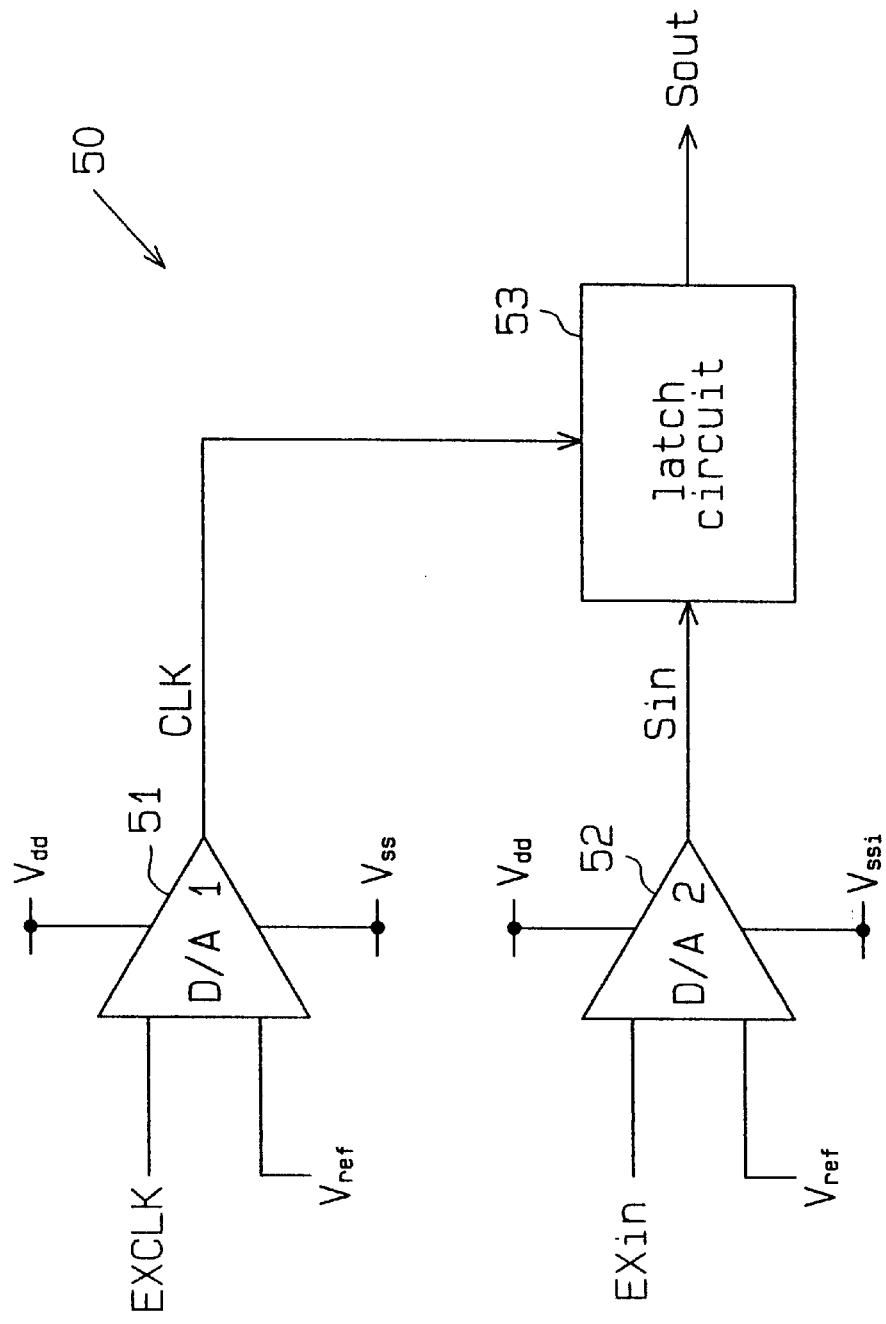
FIG. 1 is a schematic block diagram showing a conventional input circuit.
Figures 2A, 2B, 2C, 2D, 2E:
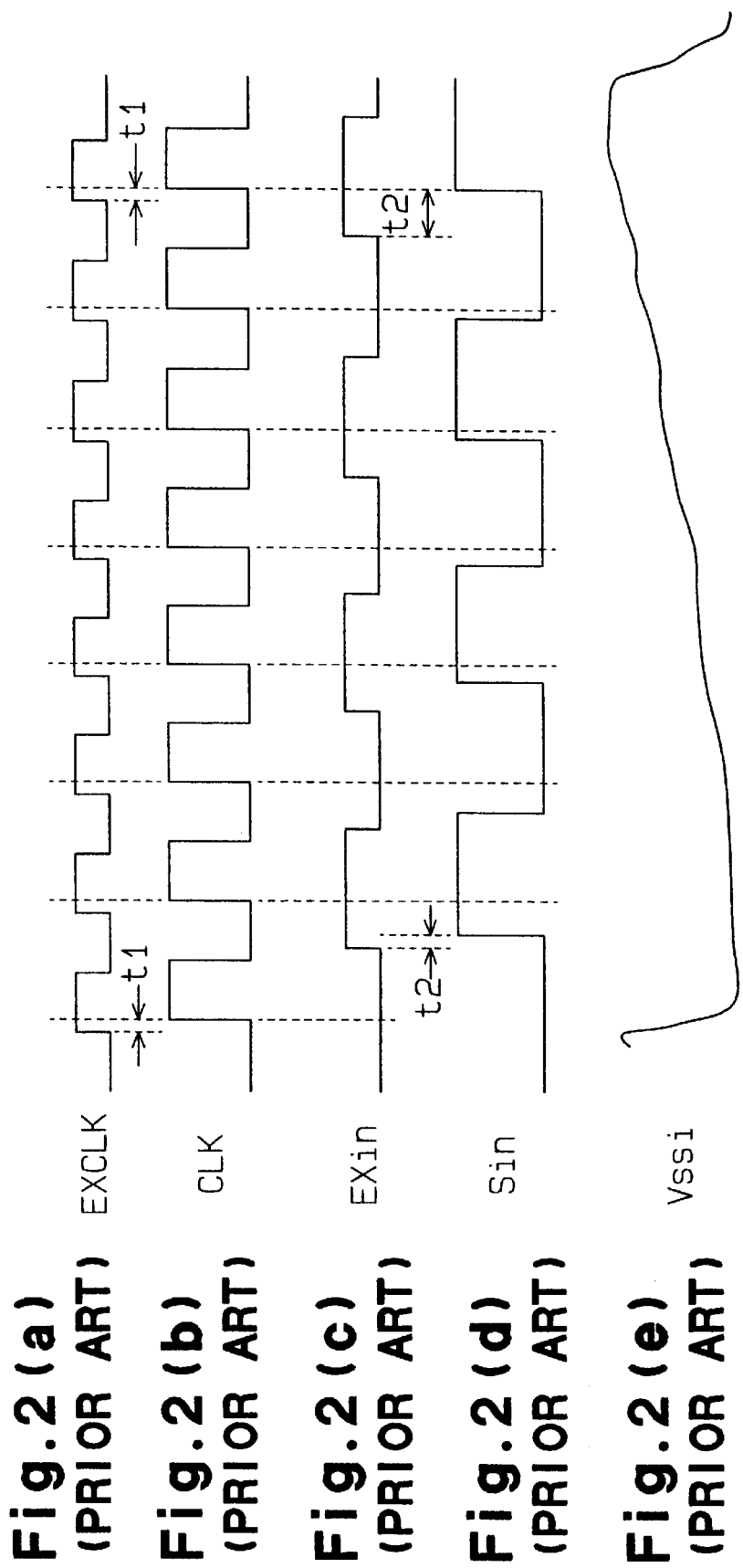
FIGS. 2(a)–(e) are timing charts of the operation of the input circuit in FIG. 1.

Referring to FIG. 3, an outline of the invention will now be described. An input circuit 100 according to the present invention comprises a first amplifier 1, a second amplifier 2, and an internal circuit 3 which receives a clock signal CLK and an input signal Sin from the first and second amplifiers 1, 2, respectively.

Power is supplied to the first amplifier 1 and the second amplifier 2 from common power supplies V3 and V4. The power supply V3 is preferably an internal power supply having a high potential obtained by stepping up the voltage of an external power supply. The power supply V4 is preferably an internal power supply having a low potential obtained by stepping down the voltage of the external power supply. The first amplifier 1 receives an external clock signal EXCLK and produces the clock signal CLK by amplifying the external clock signal EXCLK. The second amplifier 2 receives an external input signal EXin and generates the input signal Sin by amplifying external the input signal EXin. The internal circuit 3 receives the input signal Sin and the clock signal CLK.

Although the voltage levels of the power supplies V3 and V4 vary, the drive capability of each of the amplifiers 1 and 2 similarly varies. Therefore, the operating delay time of the amplifier 1 is substantially the same as that of the amplifier 2. This results in maintaining the relative relationship between the clock signal CLK and the input signal Sin allowing the internal circuit 3 to receive the input signal Sin correctly.

(First embodiment)

Figure 4:
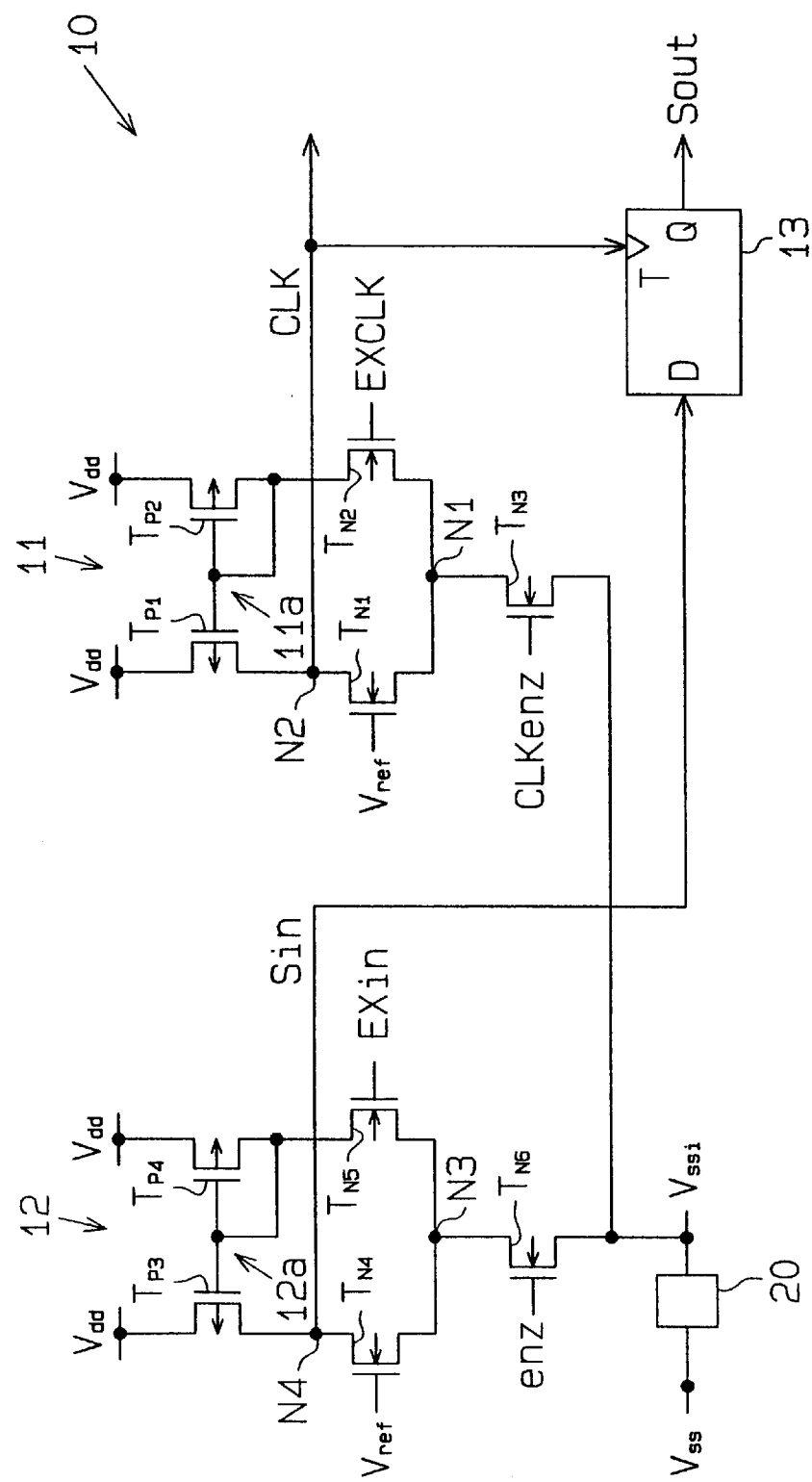
FIG. 4 is a circuit diagram of a first embodiment of an input circuit according to the present invention.
Figure 5:
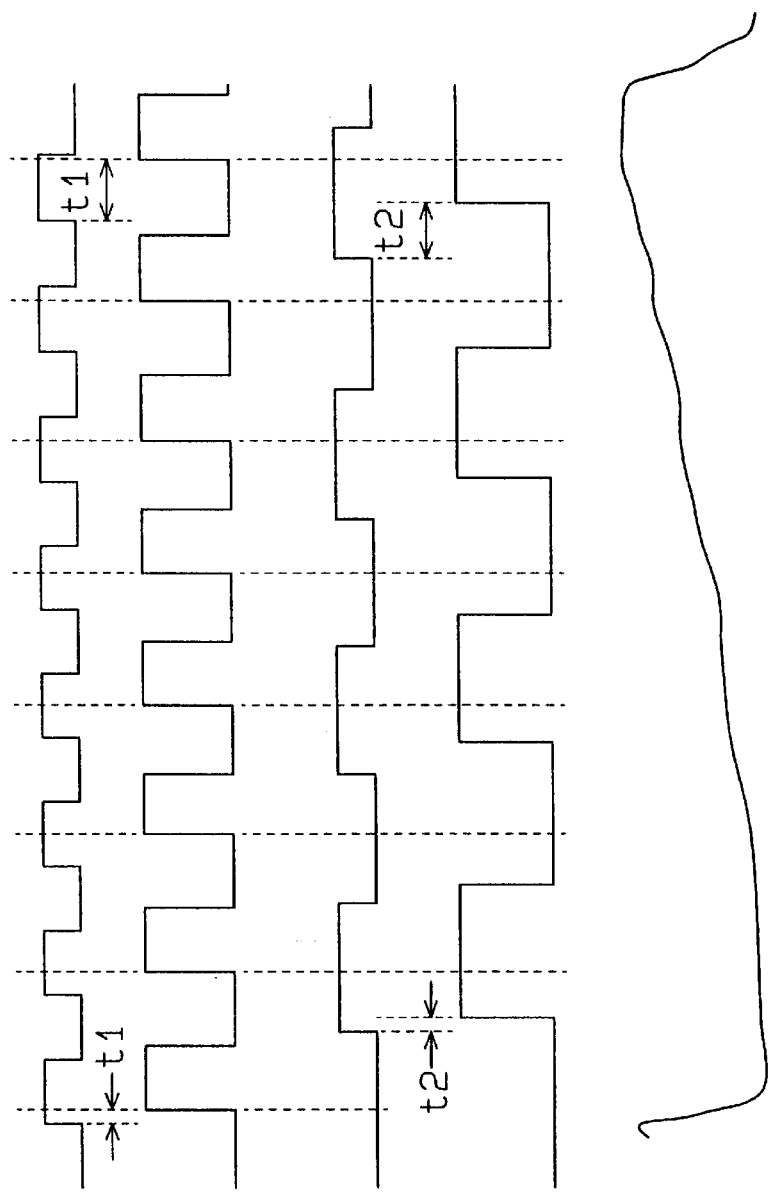
FIGS. 5(a)–(e) are timing charts of the operation of the input circuit in FIG. 4.

Referring to FIG. 4 and FIG. 5, an input circuit 10 according to a first embodiment of the present invention will now be explained. As shown in FIG. 4, the input circuit 10 comprises a first differential amplifier 11 for generating a clock signal CLK, a second differential amplifier 12 for generating an input signal Sin and a latch circuit or a D flip-flop circuit 13 which receives the clock signal CLK and the input signal Sin.

Specifically, the first differential amplifier 11 comprises p-channel MOS transistors, which are hereinafter referred to as PMOS transistors, TP1 and TP2 and n-channel MOS transistors, which are hereinafter referred to as NMOS transistors, TN1, TN2 and TN3. The PMOS transistors TP1 and TP2 form a current mirror circuit 11a. The gates of the PMOS transistors TP1 and TP2 are connected to each other and to a drain of the PMOS transistor TP2. Each of the PMOS transistors TP1 and TP2 has a source connected with a high potential power supply Vdd and a drain connected with the drains of the NMOS transistors TN1 and TN2, respectively. The sources of the NMOS transistors TN1 and TN2 are connected to each other at a node N1. The NMOS transistor TN1 has a gate that receives a reference voltage Vref and the NMOS transistor TN2 has a gate that receives an external clock signal EXCLK. The node N1 between the NMOS transistors TN1 and TN2 is connected to a step-down voltage circuit 20 via the NMOS transistor TN3. The step-down voltage circuit 20 generates a power supply voltage Vssi that is a voltage which was stepped down from the voltage of an external low potential power supply Vss. The NMOS transistor TN3 has a gate that receives an enable signal CLKenz that switches the first differential amplifier 11 to either an active or an inactive state.

In the first differential amplifier 11, the clock signal CLK is generated at the drain of the PMOS transistor TP1 and the NMOS transistor TN1, labeled node N2. The clock signal CLK is provided to a clock input-terminal T of the D flip-flop circuit 13. The NMOS transistor TN3 is switched on in response to the enable signal CLKenz having the H-level.

The operation of the first differential amplifier 11 will now be explained. The first differential amplifier 11 amplifies the external clock signal EXCLK to generate the amplified clock signal CLK. When the external clock signal EXCLK rises and the level at the signal EXCLK reaches a level that is higher than the reference voltage Vref, the drive capability of the NMOS transistor TN2 becomes higher than that of the NMOS transistor TN1. Since the drain current of the NMOS transistor TN2 becomes larger than that of NMOS transistor TN1, the drive capability of the PMOS transistors TP1 and TP2 becomes higher. Then, the potential at the node N1 rises, and the NMOS transistor TN1 is switched off while the potential of the node N2 rises close to the level of the high potential power supply Vdd.

On the other hand, when the external signal EXCLK falls and the level of the signal EXCLK drops to a level that is lower than the reference voltage Vref, the drive capability of the NMOS transistor TN2 becomes less than that of the NMOS transistor TN1. Since the drain current of the NMOS transistor TN2 falls to a level lower than that of the NMOS transistor TN1, the drive capability of the PMOS transistors TP1 and TP2 decreases. Then, the potential at the node N1 falls, and the potential at the node N2 falls close to the level of the step-down voltage Vssi.

In other words, as shown in FIG. 5, the first differential amplifier 11 amplifies the external clock signal EXCLK having a relatively small amplitude using a reference voltage Vref as a threshold. Then, the first differential amplifier 11 provides the clock input-terminal T of the D flip-flop circuit 13 with the amplified clock signal CLK having an amplitude substantially equal to the potential difference between the power supplies Vdd and Vssi. The clock signal CLK is also provided to other circuits (not shown) in addition to the D flip-flop circuit 13.

Referring back to FIG. 4, the second differential amplifier 12 comprises PMOS transistors TP3 and TP4 and NMOS transistors TN4, TN5 and TN6, and is similar to the first differential amplifier 11. The PMOS transistors TP3 and TP4 from a current mirror circuit 12a.

The NMOS transistor TN4 receives the reference voltage Vref at its gate and the NMOS transistor TN5 receives an external input signal EXin at its gate. The NMOS transistor TN6 receives an enable signal (enz) that switches the second differential amplifier 12 to either an active or an inactive state. An input signal Sin is generated at the drains of the PMOS transistor TP3 and the NMOS transistor TN4, labeled node N4. In the second differential amplifier 12, the input signal Sin is provided to a data input-terminal D of the D flip-flop circuit 13. The NMOS transistor TN6 is switched on in response to the enable signal enz having the H-level.

As shown in FIG. 5, the second differential amplifier 12 amplifies the external input signal EXin having relatively small amplitude using the reference voltage Vref as a threshold, and generates the amplified input signal Sin. The amplified input signal Sin has an amplitude equal to the potential difference between the power supplies Vdd and Vssi, and is provided to the data input-terminal D of the D flip-flop circuit 13.

The D flip-flop circuit 13 latches the input signal Sin in response to the rising of the clock signal CLK. The D flip-flop circuit 13 outputs the latched input signal Sin as an output signal Sout from an output-terminal Q to a next stage (not illustrated).

In the input circuit 10, since the common power supplies Vdd and Vssi are supplied to the first differential amplifier 11 and the second differential amplifiers 12, there is substantially no difference between the drive capability of the differential amplifiers 11 and 12. Therefore, as shown in FIG. 5, even if the level of the step-down voltage Vssi gradually rises, since the drive capability of the differential amplifiers 11, 12 decreases, the operating delay time t1 of the differential amplifier 11 is substantially equal to that of the differential amplifier 12. As a result, the relative phase relationship between the clock signal CLK and the input signal Sin is kept constant, so that the input signal Sin is correctly input to the D flip-flop circuit 13. Therefore, even if the frequency of the external clock signal EXCLK and the external input signal EXin is increased in order to increase the operation speed of the input circuit 10, the operation of the input circuit 10 is stable at all times.

(Second embodiment)

Figure 6:
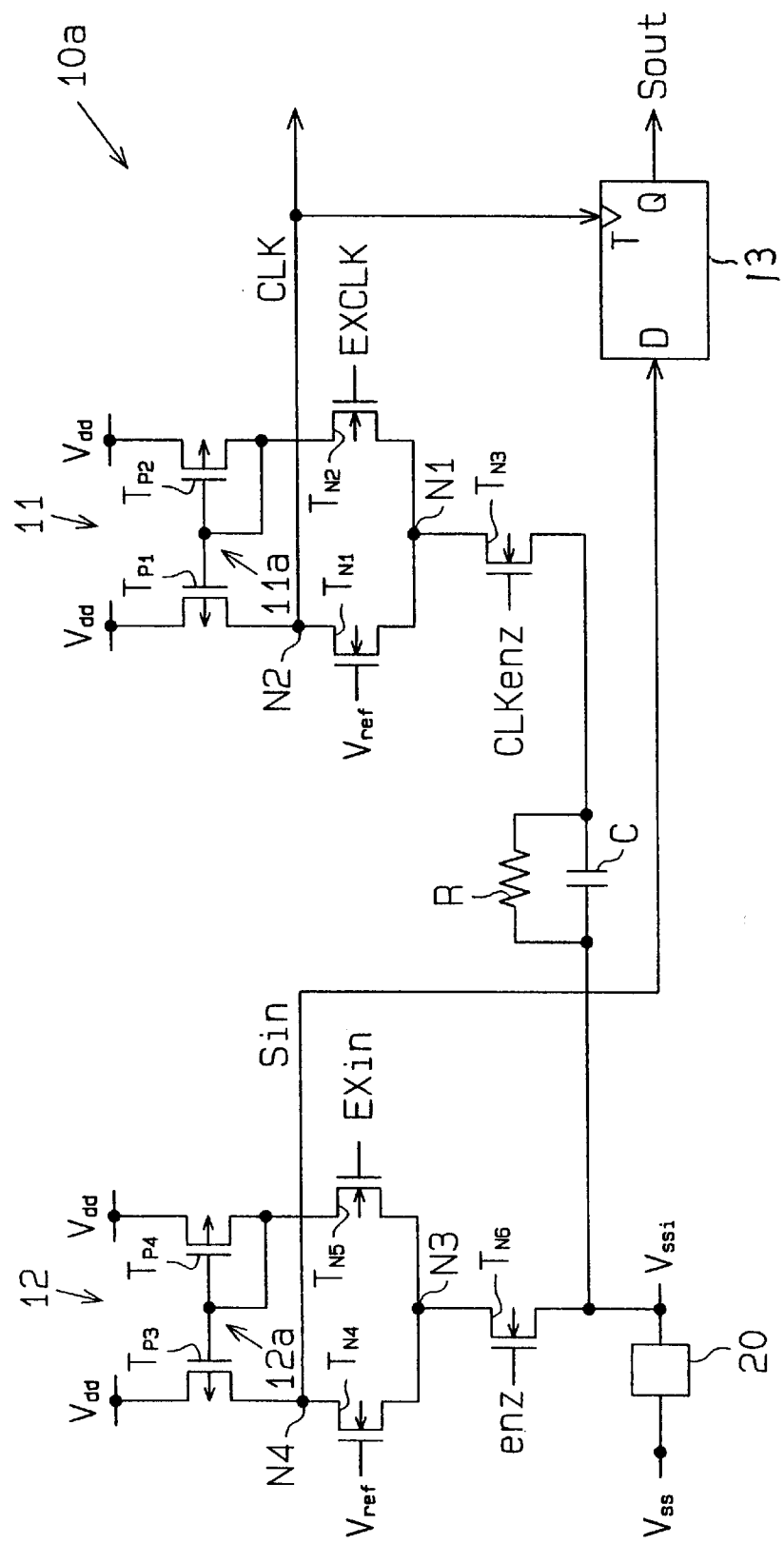
FIG. 6 is a circuit diagram of a second embodiment of an input circuit according to the present invention.

Referring to FIG. 6, an input circuit 10a according to a second preferred embodiment of the present invention will now be explained. The input circuit 10a is different from the input circuit 10 of the first embodiment in that a capacitor C and a resistor R connected in parallel between the source of the NMOS transistor TN3 and the step-down voltage Vssi.

Since the potential at the node N1 rises to a level that is higher than the level of the step-down voltage Vssi due to the resistor R, the drive capability of the first differential amplifier 11 is suppressed. If the second differential amplifier 12 is inactivate and the first differential amplifier 11 operates independently, only the clock signal CLK is provided to the next stage. In this case, it is not necessary that the first differential amplifier 11 has a high drive capability. Therefore, the power consumption of the differential amplifier 11 is reduced by suppressing the drive capability of the first differential amplifier 11.

Additionally, the potential at the node N1 is varied synchronously with the voltage level of the step-down voltage power supply Vssi by the capacitor C. Therefore, the drive capabilities of the first and second differential amplifiers 11, 12 are varied synchronously with respect to each other. As a result, the operating delay time t1 of the first differential amplifier 11 and the operating delay time t2 of the second differential amplifier 12 also varies synchronously with respect to each other. Then, since the phase between the clock signal CLK and the input signal Sin is kept constant, the D flip-flop circuit 13 receives the input signal Sin correctly all the time. Consequently, even if the frequencies of the external clock signal EXCLK and the external input signal EXin become higher, the input circuit 10a still operates stably at all times.

(Third embodiment)

Figure 7:
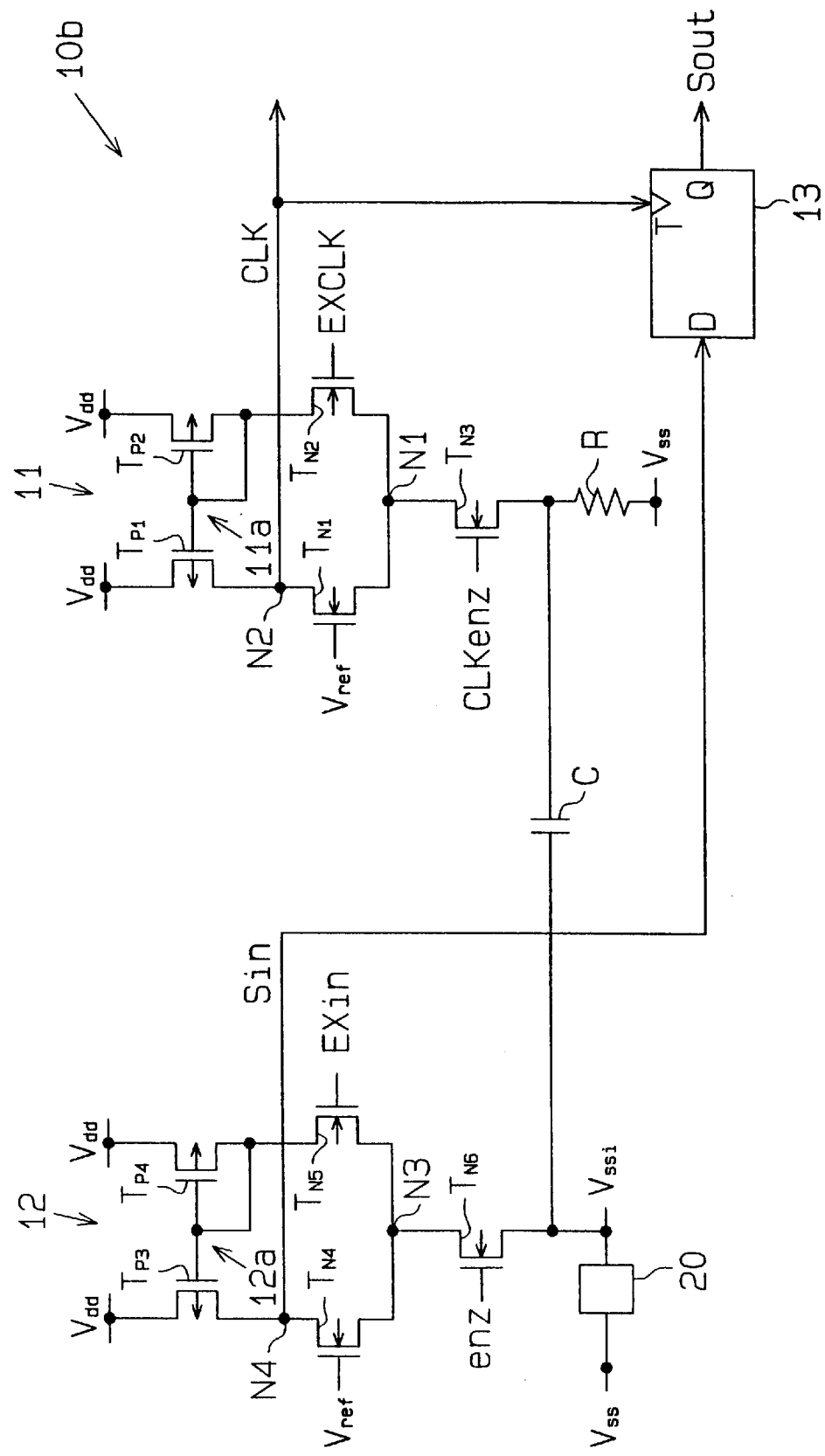
FIG. 7 is a circuit diagram of a third embodiment of an input circuit according to the present invention.

Referring now to FIG. 7, an input circuit 10b according to a third embodiment of the present invention is shown which differs from the input circuit 10a of the second embodiment in the placement of the resistor R.

Specifically, the resistor R is connected between the NMOS transistor TN3 and the low potential power supply Vss.

The input circuit 10b has the same effect as the input circuit 10a of the second embodiment. Particularly, since power is supplied to the node N1 from the power supply Vss with a higher level than the step-down voltage Vssi, the drive capability of the first differential amplifier 11 is suppressed. Therefore, the power consumption of the differential amplifier 11 is reduced.

(Fourth embodiment)

Figure 8:
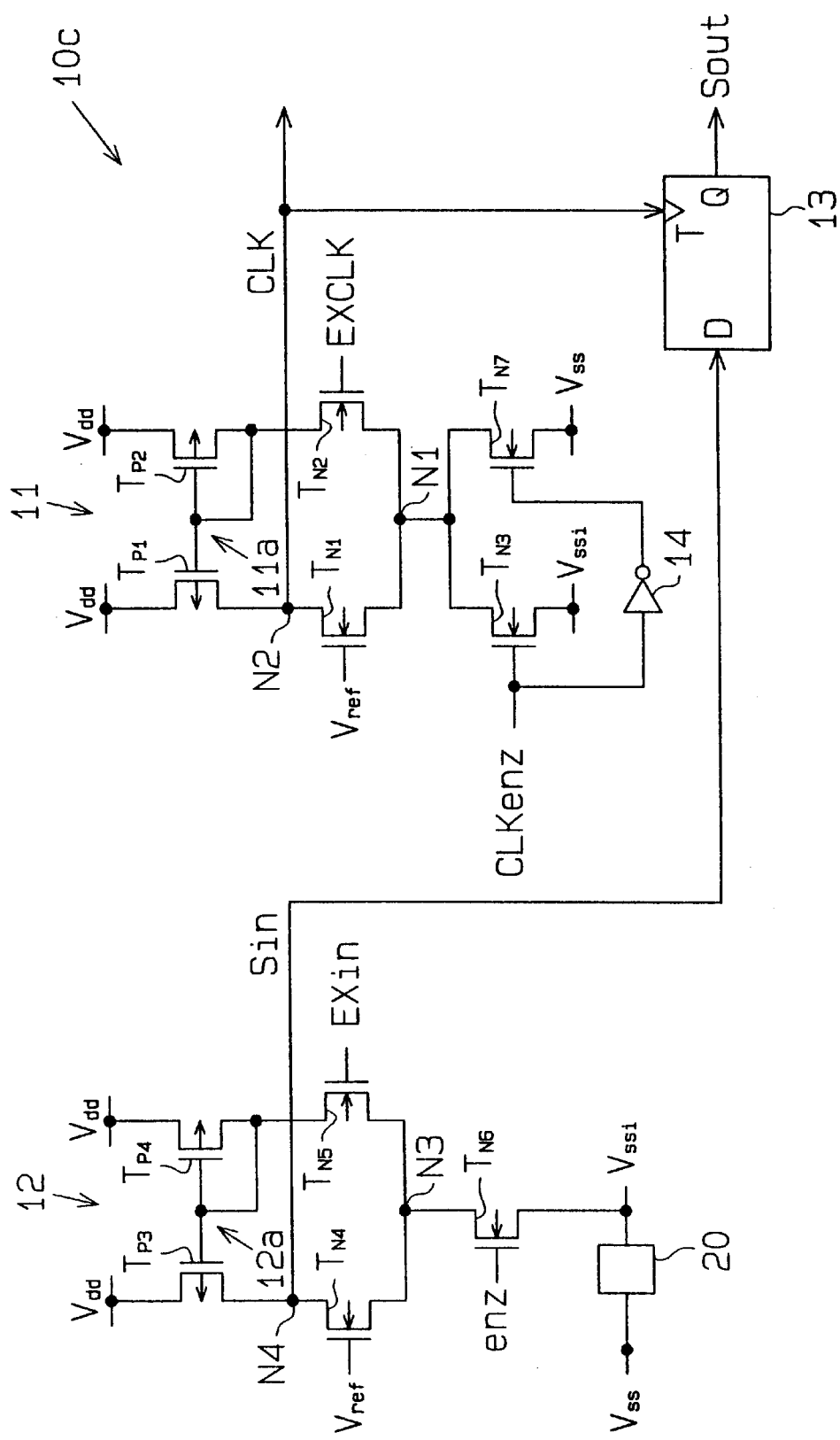
FIG. 8 is a circuit diagram of a fourth embodiment of an input circuit according to the present invention.

As shown in FIG. 8, an input circuit 10c according to a fourth embodiment of the present invention differs from the input circuit 10 of the first embodiment by including an NMOS transistor TN7 and an inverter circuit 14. The NMOS transistor TN7 has a drain connected to the node N1 and a source connected with the low potential power supply Vss. The inverter circuit 14 is connected between the gates of NMOS transistors TN3 and TN7. While the NMOS transistor TN3 receives the enable signal CLKenz at its gate, the NMOS transistor TN7 receives an inverted enable signal/CLKenz via the inverter circuit 14 at its gate. Thus, the NMOS transistors TN3 and TN7 operate complementarily.

In the input circuit 10c, when the enable signals enz and CLKenz, both of which have the H-level, are provided, the step-down voltage Vssi is provided at each of the nodes N1 and N3. Therefore, the input circuit 10c operates in a manner similar to the input circuit 10 of the first embodiment.

On the other hand, when the enable signals enz and CLKenz, both of which have the L-level, are provided, the second differential amplifier 12 is inactivated, while the NMOS transistor TN7 of the first differential amplifier 11 is switched on and the NMOS transistor TN3 is switched off. Thereby, the low potential power supply Vss is supplied to the node N1. Then, the first differential amplifier 11 amplifies the external clock signal EXCLK according to the ordinary power supplies Vdd and Vss and produces the amplified clock signal CLK.

In this case, since the clock signal CLK amplified by the first differential amplifier 11 is not required for the D flip-flop circuit 13, the first differential amplifier 11 does not have to possess a high drive capability so that the operating power supply of the first differential amplifier 11 is converted to the low potential power supply Vss with a higher level than the step-down voltage Vssi from the step-down power supply Vssi. As a result, the drive capability of the first differential amplifier 11 is suppressed, and the power consumption of the differential amplifier 11 is reduced.

(Fifth embodiment)

Figure 9:
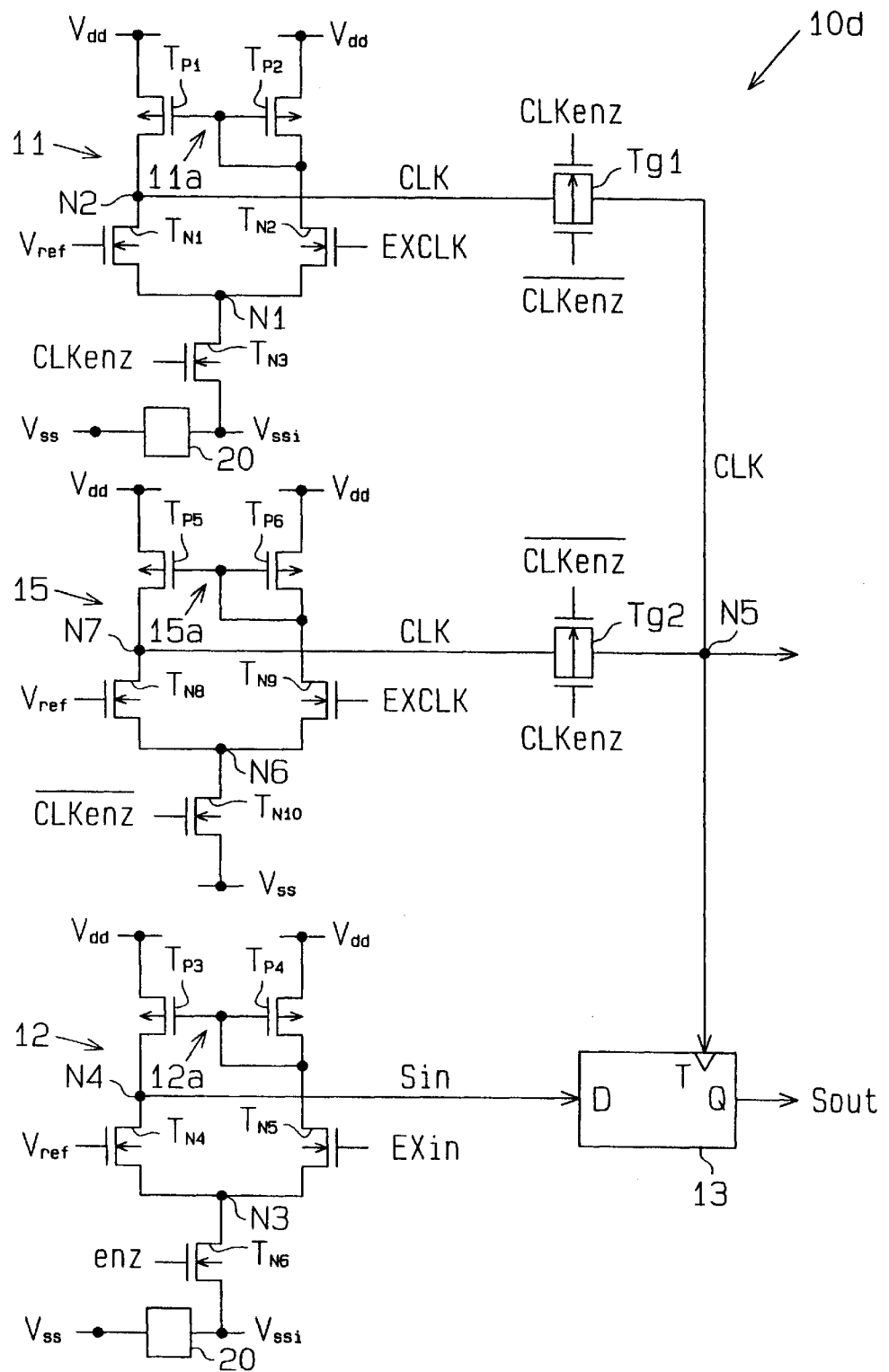
FIG. 9 is a circuit diagram of a fifth embodiment of an input circuit according to the present invention.

As shown in FIG. 9, an input circuit 10d according to a fifth embodiment of the present invention is different from the input circuit 10 of the first embodiment by including a third differential amplifier 15, a first transfer gate Tg1 and a second transfer gate Tg2. The third differential amplifier 15 amplifies the external clock signal EXCLK to generate the amplified clock signal CLK. The third differential amplifier 15 also provides the clock signal CLK to the D flip-flop circuit 13 and other circuits (not illustrated).

The first transfer gate Tg1, which comprises an NMOS transistor and a PMOS transistor, is connected between a node N2 of the first differential amplifier 11 and the clock input terminal T of the D flip-flop circuit 13. The NMOS transistor of the first transfer gate Tg1 receives an enable signal CLKenz at its gate, and the PMOS transistor receives a signal/CLKenz, which is the enable signal CLKenz inverted.

The first differential amplifier 11 is activated in response to the enable signal CLKenz with the H-level and produces the clock signal CLK at the node N2. Then, the first transfer gate Tg1 is made conductive by the enable signal CLKenz having the H-level, and the clock signal CLK is provided to the D flip-flop circuit 13 and other circuits from the node N2.

The third differential amplifier 15 is connected with a node N5 between the first transfer gate Tg1 and the clock input terminal T via the transfer gate Tg2. The third differential amplifier 15 comprises PMOS transistors TP5 and TP6 and NMOS transistors TN8, TN9 and TN10, and has the same design as the first differential amplifier 11. The PMOS transistors TP5 and TP6 form a current mirror circuit 15a. The low potential power supply Vss is supplied to a source of the NMOS transistor TN10, and the inverted signal/CLKenz is provided to the gate of the NMOS transistor TN10.

Then, the second transfer gate Tg2, which comprises an NMOS transistor and a PMOS transistor, is connected between a node N7 and the node N5. The NMOS transistor of the second transfer gate Tg2 receives the signal/CLKenz, at its gate, and the PMOS transistor receives the enable signal CLKenz at its gate.

The third differential amplifier 15 is activated by switching on the NMOS transistor TN10 in response to the inverted signal/CLKenz having the H-level, or the enable signal CLKenz having the L-level. The third differential amplifier 15 operates complementarily with the first differential amplifier 11, and amplifies the external clock signal EXCLK having a relatively small amplitude using the reference voltage Vref as a threshold. Then, the third differential amplifiers 15 provides the clock signal CLK having an amplitude equal to the potential difference between the power supplies Vdd and Vss to the clock input terminal T of the D flip-flop circuit 13 and other circuits.

In the input circuit 10d, when the enable signal enz and CLKenz, both of which have the H-level, are provided, the first and second differential amplifiers 11, 12 are activated, and the third differential amplifier 15 is inactivated. Therefore, the input circuit 10d of the fifth preferred embodiment operates in a manner similar to the first differential amplifier 11.

On the other hand, when the enable signal enz and CLKenz, both of which have the L-level, are provided, the first and second differential amplifiers 11, 12 are deactivated, and the third differential amplifier 15 is activated. Then, the third differential amplifier 15 produces the clock signal CLK by amplifying the external clock signal EXCLK according to the ordinary power supplies Vdd and Vss and provides the clock signal CLK to the D flip-flop circuit 13 and other circuits.

In this case, the differential amplifier for the purpose of providing the clock signal CLK is switched from the first differential amplifier 11 to the third differential amplifier 15. Then, the drive capability of the third differential amplifier 15 is smaller than that of the first differential amplifier 11 because it uses the power supplies Vdd and Vss as operating power supplies. Therefore, the power consumption of the input circuit 10d is reduced.

(Sixth embodiment)

Figure 10:
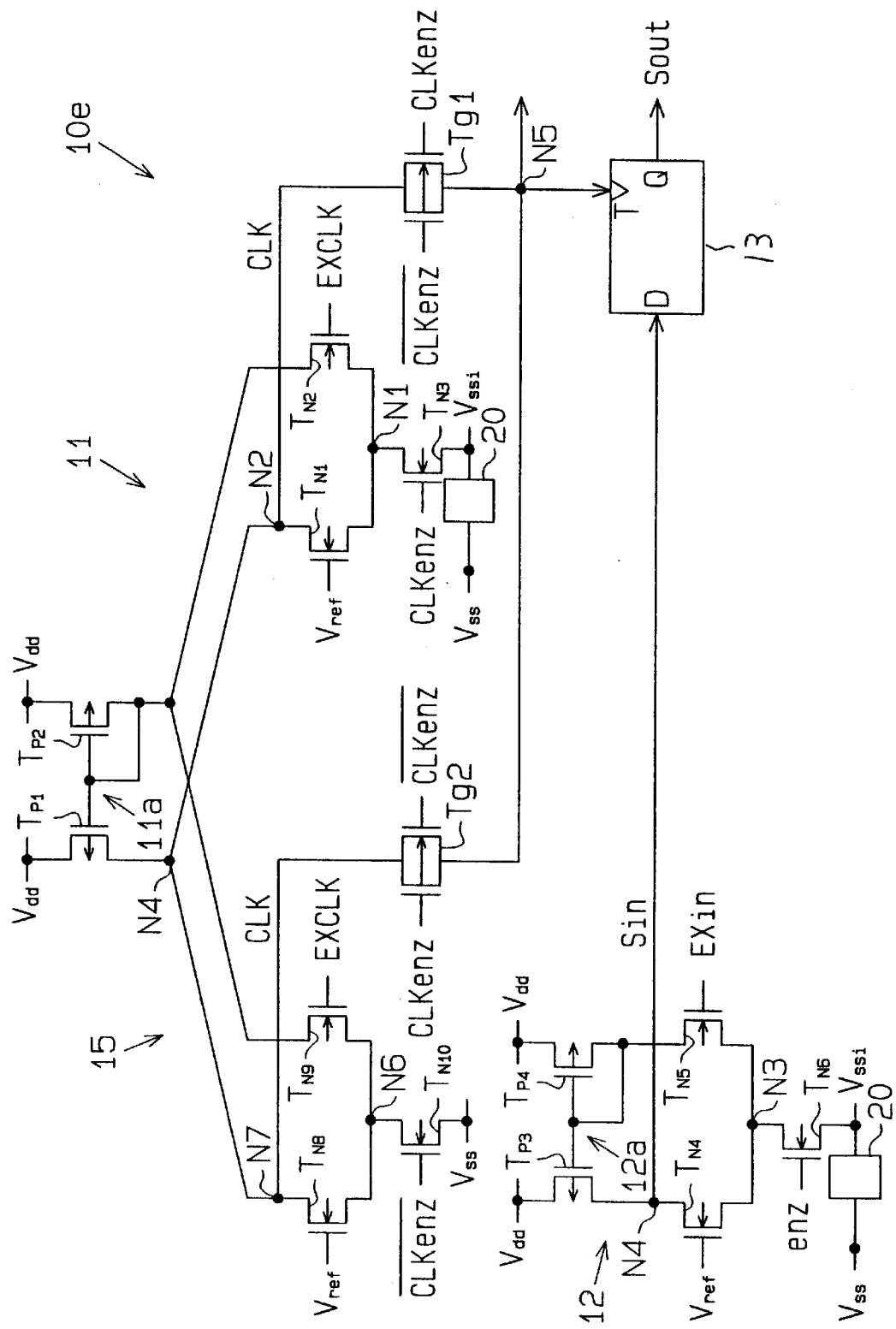
FIG. 10 is a circuit diagram of a sixth embodiment of an input circuit according to the present invention.

As shown in FIG. 10, an input circuit 10e according to a sixth embodiment of the present invention is shown. The input circuit 10e differs from the input circuit 10d of the fifth embodiment in that the first differential amplifier 11 and the third differential amplifier 15 are combined such that they share the current mirror circuit 11a. Specifically, the PMOS transistors TP5 and TP6 of the third differential amplifier 15 are omitted, and the NMOS transistors TN8 and TN9 are connected to the PMOS transistors TP1 and TP2, respectively. The input circuit 10e operates in a manner similar to the input circuit 10d of the fifth embodiment.

Because the PMOS transistors TP5 and TP6 are omitted by combining the current mirror circuit 11a of the first differential amplifier 11 with that of the third differential amplifier 13, the circuit area is reduced.

It should be apparent to those skilled in the art that the present invention may be embodied in many other specific forms without departing from the spirit or scope of the invention. Particularly, it should be understood that the invention may be embodied in the following forms.

In the above embodiments, the layout of the first and second amplifiers 11, 12 on a chip may be changed depending on the wiring capacitances between the first differential amplifier 11 and the D flip-flop circuit 13 and between the second differential amplifier 12 and the D flip-flop circuit 13. Specifically, it is favorable to place the first differential amplifier 11 and the second differential amplifier 12 such that the relative phase difference between the clock signal CLK input to the D flip-flop 13 and the input signal Sin is less than 10 degrees, which is an interval of 1/36 cycles of the clock signal CLK to ensure that the D flip-flop circuit 13 receives the correct input signal Sin.

Figure 11:
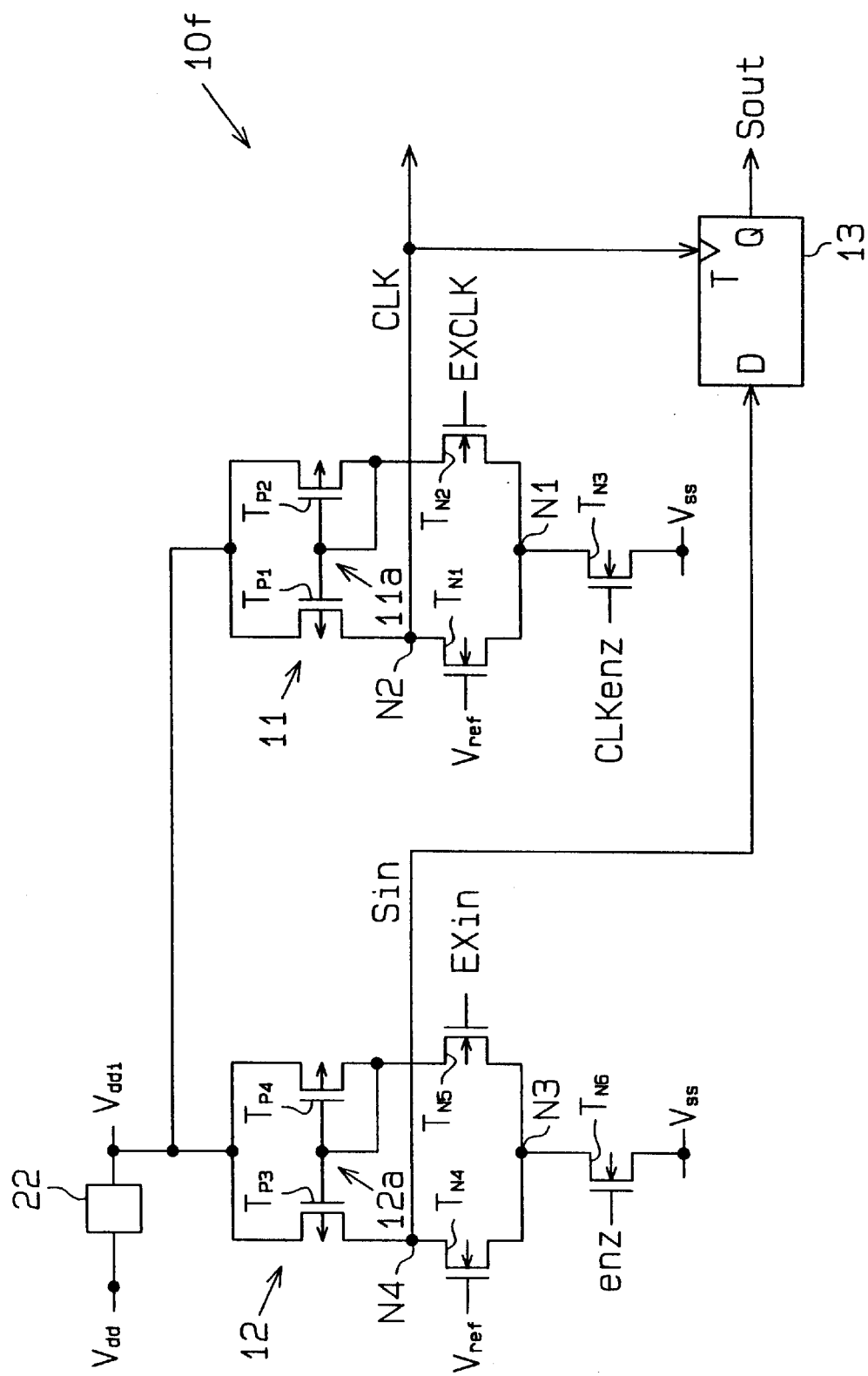
FIG. 11 is a circuit diagram of a seventh embodiment of an input circuit according to the present invention.
Figure 12:
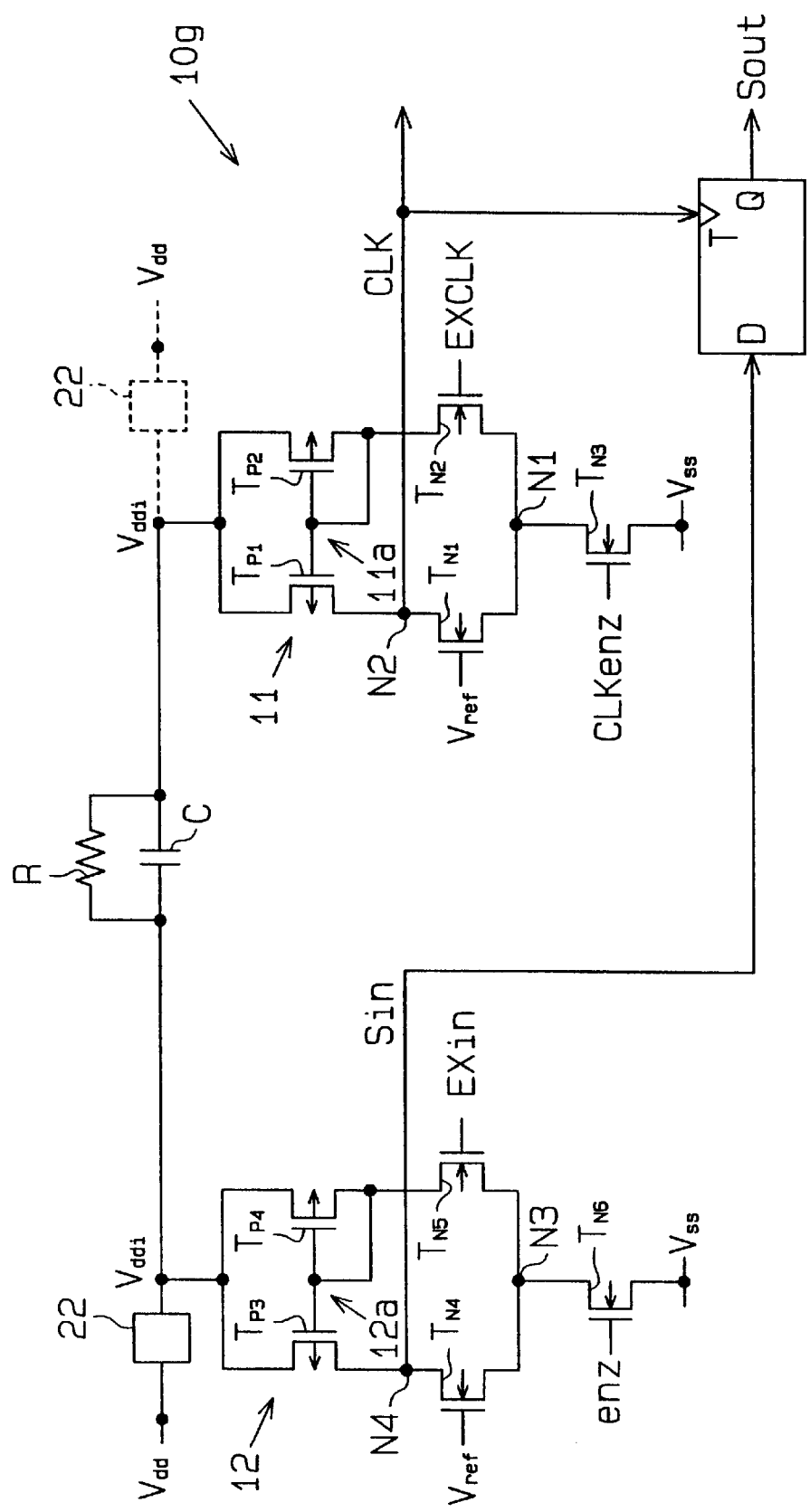
FIG. 12 is a circuit diagram of a eighth embodiment of an input circuit according to the present invention.
Figure 13:
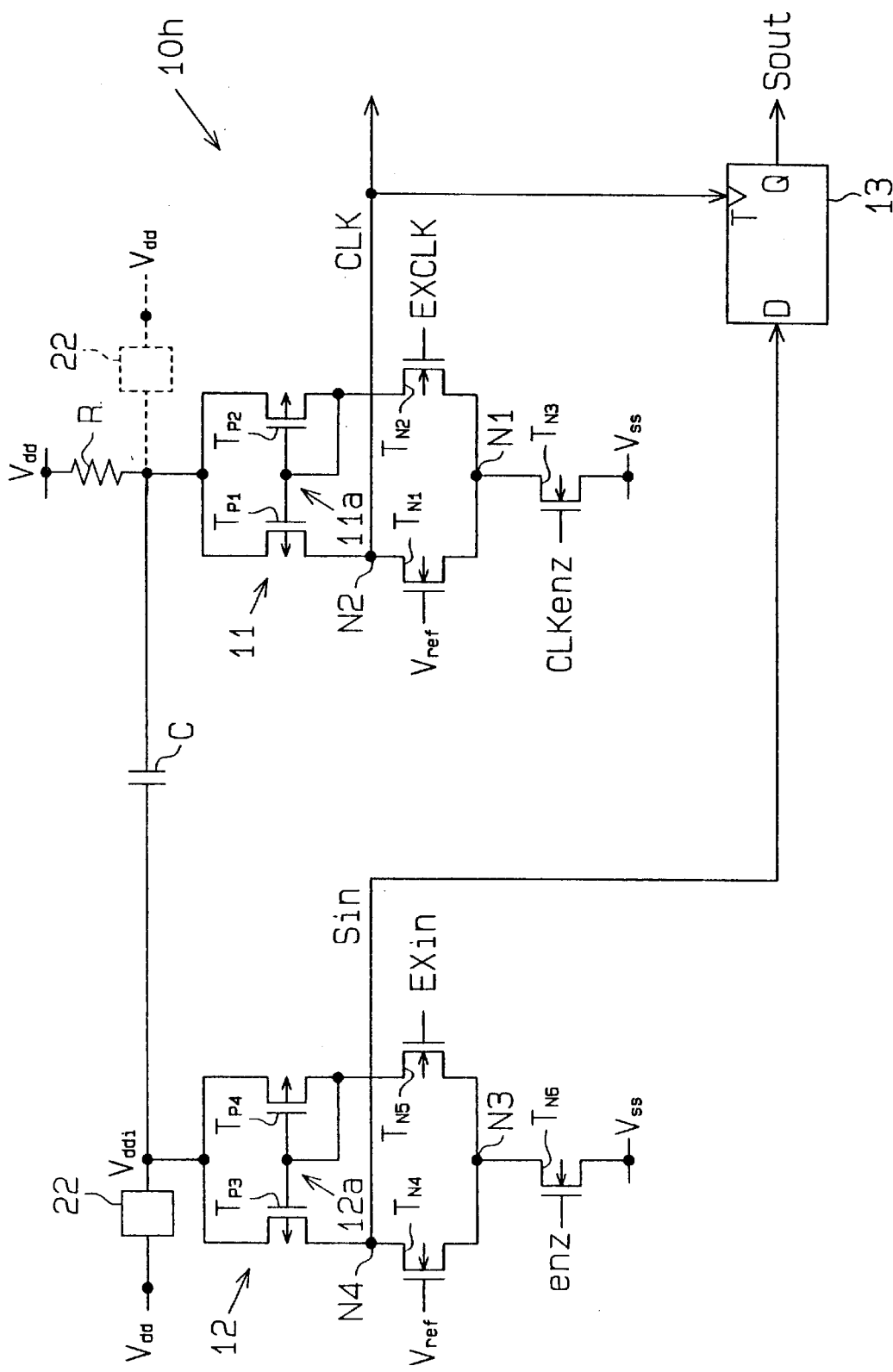
FIG. 13 is a circuit diagram of a nineth embodiment of an input circuit according to the present invention.
Figure 14:
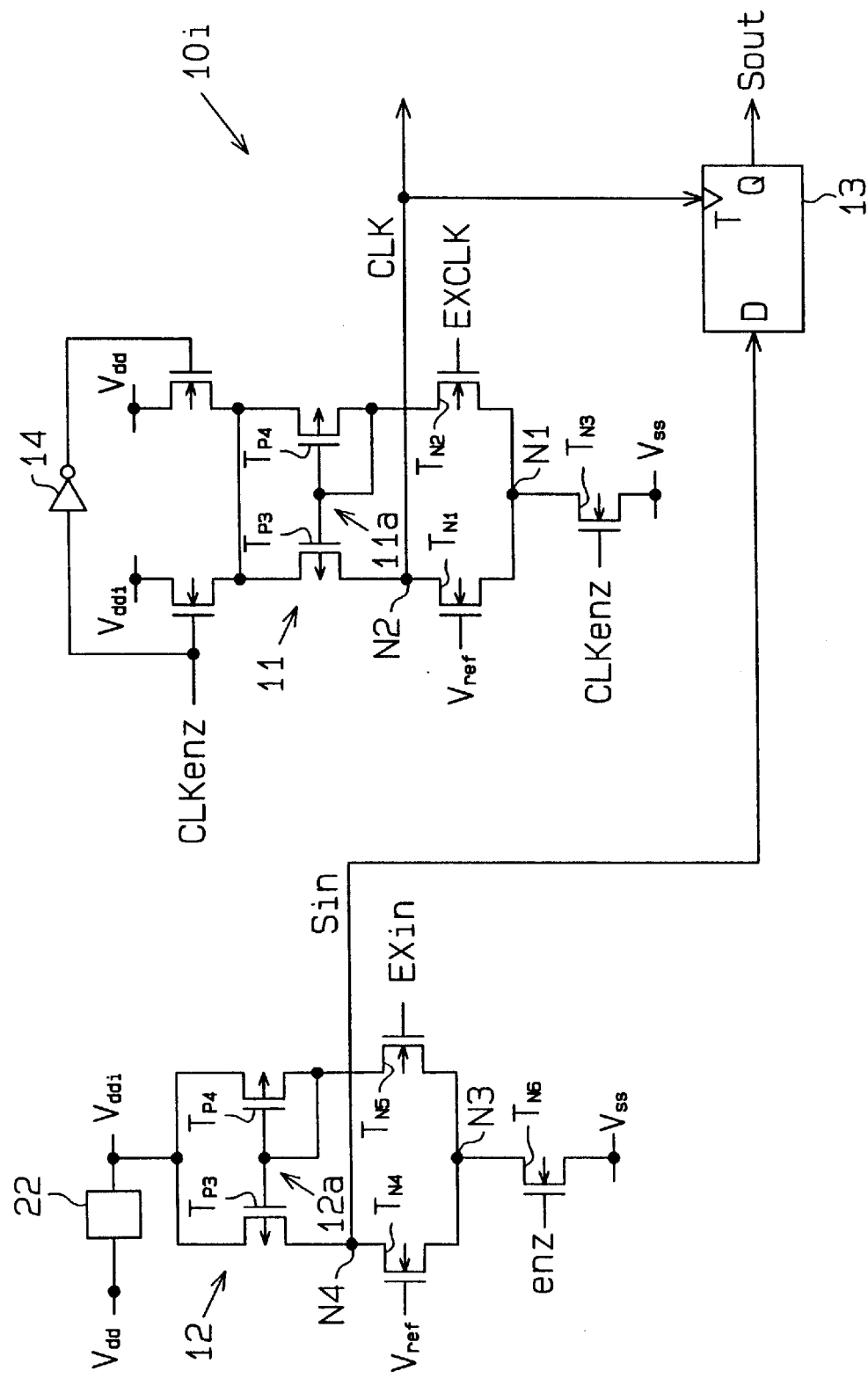
FIG. 14 is a circuit diagram of a tenth embodiment of an input circuit according to the present invention.
Figure 15:
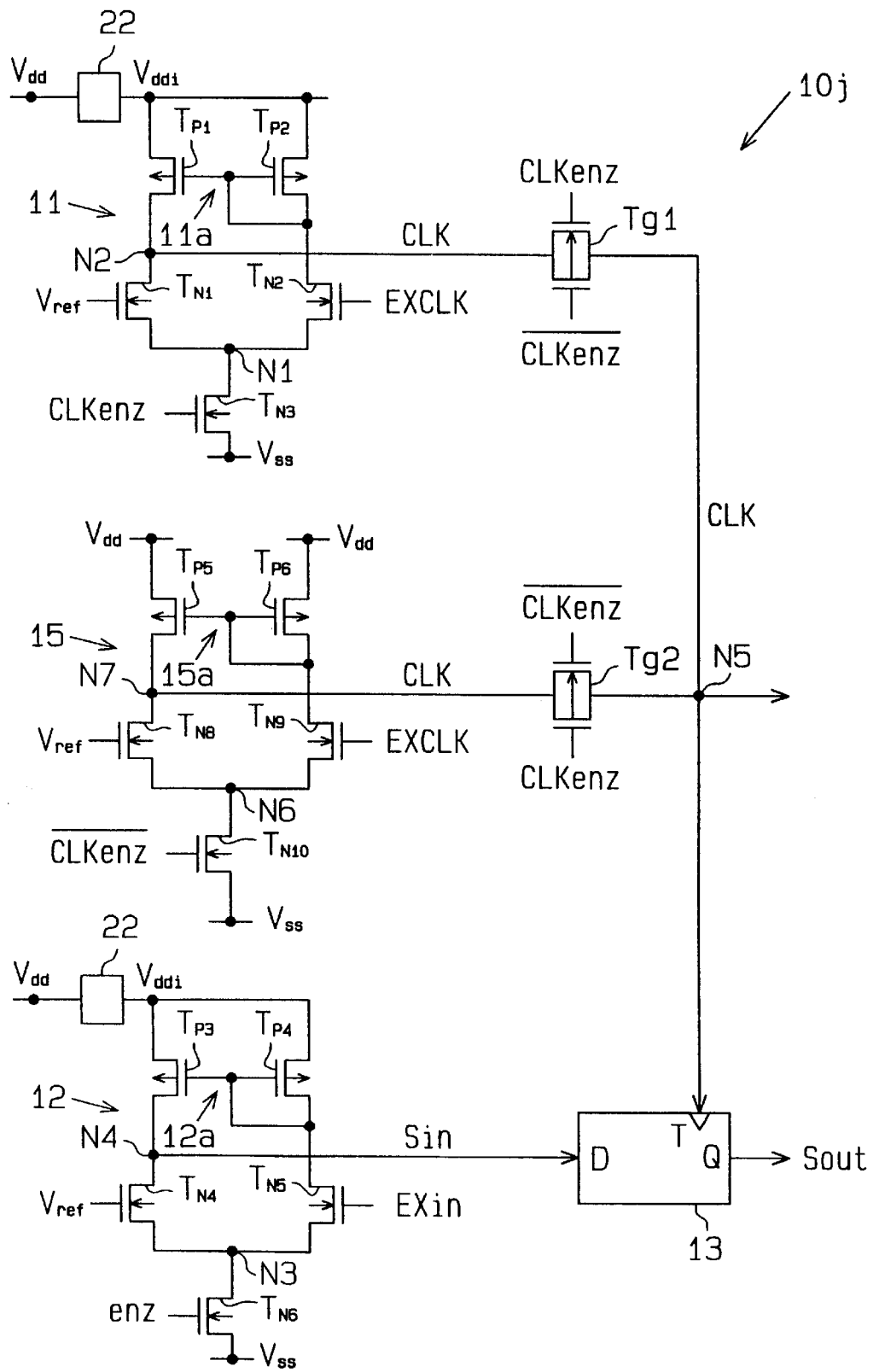
FIG. 15 is a circuit diagram of a eleventh embodiment of an input circuit according to the present invention.

Referring to FIGS. 11 to 15, in the above embodiments, instead of supplying the step-down supply voltage Vssi to the first and second differential amplifiers 11, 12, a step-up supply voltage Vddi, which is stepped up from the high potential power supply Vdd, may be supplied to the amplifiers 11, 12. In this case, a step-up voltage circuit 22 is used to step up the high potential power supply Vdd and the ordinary power supply Vss is used as the low potential power supply for the first and second differential amplifiers 11, 12. FIGS. 11 to 15 shows seventh to eleventh embodiments, which correspond to the first to fifth embodiments of FIGS. 4 and 6 to 9, respectively. Since it will be readily apparent to one of ordinary skill in the art how the circuits shown in FIGS. 11–15 operate, given the above descriptions for the corresponding embodiments (FIGS. 4 and 6 to 9), further discussion of FIGS. 11–15 is not deemed necessary. In FIGS. 11 and 12, the step-up voltage circuit 22 may be connected to the first amplifier 11 instead of the second amplifier 12.

Alternatively, both the step-down voltage Vssi and the step-up voltage may be supplied to each of the differential amplifiers 11 and 12.

Also, instead of the D flip-flop circuit 13, other latch circuits may be used. Alternatively, any type of internal circuits, which receive the input signal Sin generated by the second differential amplifier 12 in response to the clock signal CLK generated by the first differential amplifier 11, may be employed.

Therefore, the present examples and embodiments are to be considered as illustrative and not restrictive and the invention is not to be limited to the details given herein, but may be modified within the scope and equivalence of the appended claims.

What is claimed is:

1. An input circuit, comprising:
    a first amplifier which receives an external clock signal and amplifies the external clock signal to generate an internal clock signal;
    a second amplifier which receives an external input signal and amplifies the external input signal to generate an internal input signal;
    an internal circuit, connected to the first and second amplifiers, which receives the internal input signal from the second amplifier in response to the internal clock signal from the first amplifier;
    wherein the first and second amplifiers receive power from a high potential power supply and a low potential power supply, the high potential power supply and the low potential power supply together being selected from a group consisting of:
        an external high potential power supply and a step-down voltage power supply that steps down a voltage received from an external low potential power supply;
        an external low potential power supply and a step-up voltage power supply that steps up a voltage received from an external high potential power supply; and
        a step-down voltage power supply that steps down a voltage received from an external low potential power supply and a step-up voltage power supply that steps up a voltage received from an external high potential power supply.

2. The input circuit according to claim 1, wherein power is supplied to the first and second amplifiers from the external high potential power supply and the step-down voltage power supply.

3. The input circuit according to claim 2, further comprising a resistor and a capacitor connected between the step-down voltage power supply and the first amplifier, wherein the resistor and the capacitor are connected in parallel.

4. The input circuit according to claim 2, wherein the first amplifier receives power from the step-down voltage power supply and also from the external low potential power supply in parallel, and the input circuit further comprises:
    a capacitor connected between the step-down voltage power supply and the first amplifier; and
    a resistor connected between the first amplifier and the external low potential power supply.

5. The input circuit according to claim 2, wherein the first amplifier receives power from the step-down voltage power supply and also from the external low potential power supply in parallel, and the input circuit further comprises a switching circuit which selectively supplies one of the step-down voltage power supply and the external power supply to the first amplifier.

6. The input circuit according to claim 5, further comprising a switch which selectively switches on and off the second amplifier in response to an enable signal, wherein the switching circuit supplies the first amplifier with power from the common step-down power supply with respect to the second amplifier when the second amplifier is switched on, and the switching circuit supplies the first amplifier with power from the external low potential power supply when the second amplifier is switched off.

7. The input circuit according to claim 2, further comprising:
    a switch which selectively switches on and off the second amplifier in response to an enable signal;
    a third amplifier which receives the external clock signal and amplifies the external clock signal to generate second internal clock signal, wherein the third amplifier receives power from the external high potential power supply and the external low potential power supply; and
    an activating circuit which selectively switches on one of the first and the third amplifiers, wherein the activating circuit switches on the first amplifier when the second amplifier is turned on, and the activating circuit switches on the third amplifier when the second amplifier is turned off.

8. The input circuit according to claim 7, wherein each of the first and third amplifiers share a current mirror circuit.

9. The input circuit according to claim 1, wherein the internal circuit comprises a latch circuit that latches the internal input signal.

10. The input circuit according to claim 1, wherein the first and second amplifiers are arranged on a semiconductor integrated circuit such that a phase difference between the internal clock signal and the internal input signal is less than 10 degrees.

11. The input circuit according to claim 1, wherein the first and second amplifiers receive power from the step-down voltage power supply that steps down a voltage received from the external low potential power supply and the step-up voltage power supply that steps up a voltage received from the external high potential power supply.

12. The input circuit according to claim 1, wherein power is supplied to the first and second amplifiers from the external low potential power supply and the step-up voltage power supply.

13. The input circuit according to claim 12, further comprising a resistor and a capacitor connected between the step-up voltage power supply and the first amplifier, wherein the resistor and the capacitor are connected in parallel.

14. The input circuit according to claim 12, wherein the first amplifier receives power from the step-up voltage power supply and also from the external high potential power supply in parallel, and the input circuit further comprises:
    a capacitor connected between the step-up voltage power supply and the first amplifier; and
    a resistor connected between the first amplifier and the external high potential power supply.

15. The input circuit according to claim 12, wherein the first amplifier receives power from the step-up voltage power supply and also from the external high potential power supply in parallel, and the input circuit further comprises a switching circuit which selectively supplies one of the step-up voltage power supply and the external power supply to the first amplifier.

16. The input circuit according to claim 15, further comprising a switch which selectively switches on and off the second amplifier in response to an enable signal, wherein the switching circuit supplies the first amplifier with power from the common step-up power supply with respect to the second amplifier when the second amplifier is switched on, and the switching circuit supplies the first amplifier with power from the external high potential power-supply when the second amplifier is switched off.

17. The input circuit according to claim 12, further comprising;
   a switch which selectively switches on and off the second amplifier in response to an enable signal;
   a third amplifier which receives the external clock signal and amplifies the external clock signal to generate second internal clock signal, wherein the third amplifier receives power from the external high potential power supply and the external low potential power supply; and
   an activating circuit which selectively switches on one of the first and the third amplifiers, wherein the activating circuit switches on the first amplifier when the second amplifier is turned on, and the activating circuit switches on the third amplifier when the second amplifier is turned off.

18. The input circuit according to claim 17, wherein each of the first and third amplifiers share a current mirror circuit.

19. An input circuit, comprising:
   a first amplifier receiving an external clock signal at a first input and a reference voltage signal at a second input, and generating an amplified clock signal;
   a second amplifier receiving an external input signal at a first input and the reference voltage at a second input, and generating an amplified input signal;
   a latch circuit connected to the first and second amplifiers, the latch circuit receiving the amplified clock signal at a clock input thereof and receiving the amplified input signal at a data input thereof,
   wherein the first and second amplifiers receive a high voltage supply signal from a common high potential power supply and a low voltage supply signal from a common low potential power supply; and
   a first transistor connected between the first amplifier and the low potential power supply, wherein a clock enable signal is received at the gate of the first transistor.

20. The input circuit of claim 19, further comprising a second transistor connected between the second amplifier and the low potential power supply, wherein an input enable signal is received at the gate of the second transistor.

21. The input circuit of claim 20, wherein the drains of the first and second transistors are connected to the low potential power supply.

22. The input circuit of claim 21, further comprising a resistor and a capacitor connected between the drain of the first transistor and the drain of the second transistor and the low potential power supply, wherein the resistor and the capacitor are connected in parallel with each other.

23. The input circuit of claim 21, wherein the low potential power supply comprises an internal power supply, the input circuit further comprising:
   a capacitor connected between the drain of the first transistor and the drain of the second transistor and the low potential power supply; and
   a resistor connected between the drain of the first transistor and an external low potential power supply, wherein the low potential power supply generates a low voltage signal by stepping down a voltage received from the external low potential power supply.

24. The input circuit of claim 21, wherein the low potential power supply comprises an internal power supply, the input circuit further comprising:
   a third transistor having a source connected to the source of the first transistor and a drain connected to an external low voltage power supply; and
   an inverter having an input connected to the gate of the first transistor and an output connected to the gate of the third transistor.

25. The input circuit of claim 21, further comprising:
   a first transfer gate, connected between the first amplifier and the latch circuit, for enabling the transfer of the amplified clock signal to the latch circuit;
   a third amplifier receiving the external clock signal at a first input and a reference voltage signal at a second input, and generating a second amplified clock signal; and
   a second transfer gate, connected between the first amplifier and the latch circuit, for enabling the transfer of the second amplified clock signal to the latch circuit, wherein third amplifier receives power from the high potential power supply and an external low potential power supply and wherein when the first transfer gate is enabled, the second transfer gate is disabled and when the second transfer gate is enabled, the first transfer gate is disabled.

26. The input circuit of claim 25, wherein the first and third amplifiers have a common current mirror circuit.

* * * * *